US012007254B2

(12) United States Patent
Marderosian

(10) Patent No.: US 12,007,254 B2
(45) Date of Patent: Jun. 11, 2024

(54) ROCKER ACTUATOR POTENTIOMETER

(71) Applicant: Panasonic Automotive Systems Company of America, Division of Panasonic Corporation of North America, Peachtree City, GA (US)

(72) Inventor: Daniel John Marderosian, Livonia, MI (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 12 days.

(21) Appl. No.: 17/707,831

(22) Filed: Mar. 29, 2022

(65) Prior Publication Data

US 2022/0282995 A1  Sep. 8, 2022

Related U.S. Application Data

(63) Continuation of application No. 17/065,747, filed on Oct. 8, 2020, now Pat. No. 11,313,701.

(60) Provisional application No. 62/928,777, filed on Oct. 31, 2019.

(51) Int. Cl.
  *G01D 5/14*  (2006.01)
(52) U.S. Cl.
  CPC .................... *G01D 5/145* (2013.01)

(58) Field of Classification Search
  CPC ...................................................... G01D 5/145
  See application file for complete search history.

(56) References Cited

U.S. PATENT DOCUMENTS

| | | | | |
|---|---|---|---|---|
| 2003/0110847 A1* | 6/2003 | Kubo | ................... | G01D 11/245 73/114.37 |
| 2007/0242043 A1* | 10/2007 | Yang | ..................... | G05G 9/047 345/161 |
| 2010/0265176 A1* | 10/2010 | Olsson | .................... | G06F 3/016 345/161 |
| 2012/0274563 A1* | 11/2012 | Olsson | ................... | G05G 9/047 345/161 |

* cited by examiner

*Primary Examiner* — Stephanie E Bloss
*Assistant Examiner* — Michael A Harrison
(74) *Attorney, Agent, or Firm* — Laurence S. Roach, Esq.

(57) ABSTRACT

A manual control for an electronic apparatus includes a manually activated rocker actuator mechanism coupled to a magnet source. The magnet source is in a rest position relative to a Variable Hall effect sensor device when the rocker actuator mechanism is in a rest position. A variable output signal from the sensor device is substantially at a minimum value when the magnet source is in the rest position relative to the sensor device. The magnet source is in a maximum position relative to the sensor device when the rocker actuator mechanism is in a maximum position. The variable output signal is substantially at a maximum value when the magnet source is in the maximum position relative to the sensor device.

10 Claims, 4 Drawing Sheets

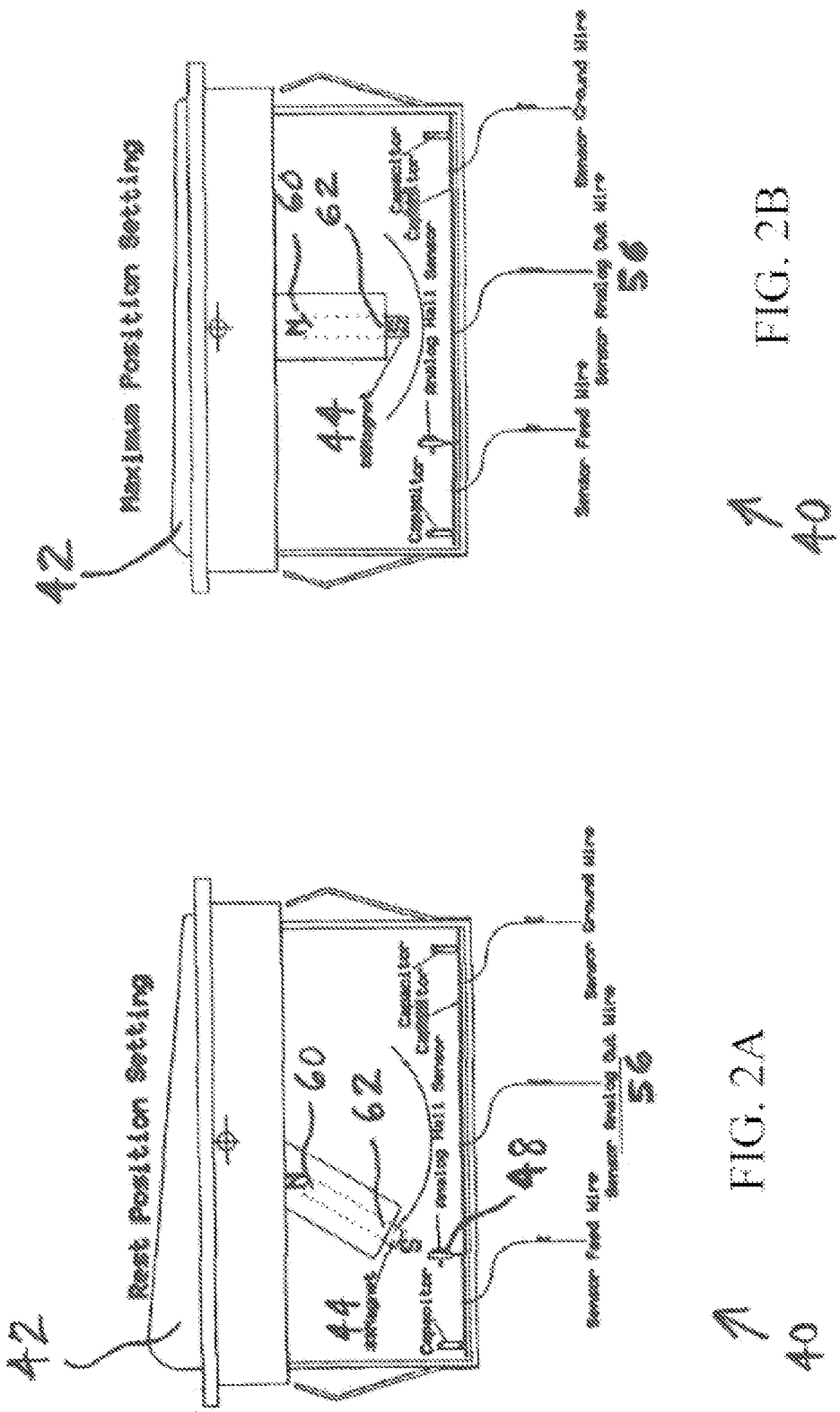

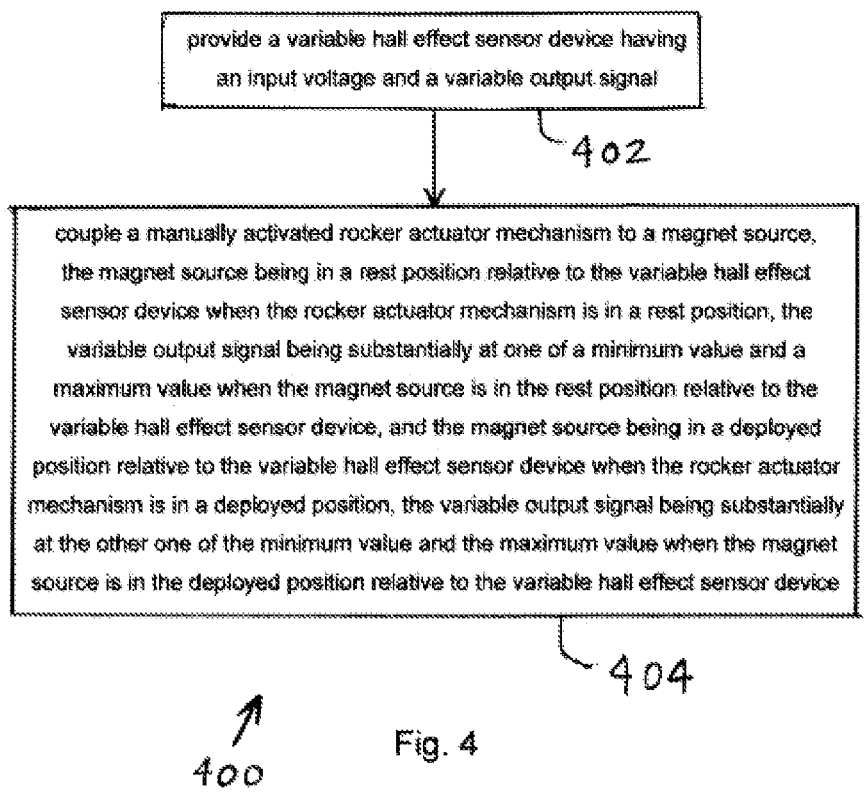

ROCKER ACTUATOR POTENTIOMETER

CROSS-REFERENCED TO RELATED APPLICATIONS

This application is a continuation of U.S. patent application Ser. No. 17/065,747, filed on Oct. 8, 2020, U.S. Pat. No. 11,313,701, Issued on Apr. 26, 2022, which claims benefit of U.S. Provisional Application No. 62/928,777, filed on Oct. 31, 2019, the disclosure of which are hereby incorporated by reference in their entirety for all purposes.

BACKGROUND OF THE INVENTION

1. Field of the Invention

The present invention relates to the use of a manually operated electromechanical control device to be used as an electronic controls apparatus to change the operating parameters of an electrically controlled system.

2. Description of the Related Art

It is known for operating parameters (e.g., audio volume, brightness, speed, motion, position, magnitude and/or amplitude control) of electronic apparatuses to be manually increased and decreased currently by using a rotating or slider type of resistive control device.

SUMMARY OF THE INVENTION

The invention incorporates a spring return (e.g., rocker type actuator mechanism) a variably controlled analog voltage or digital output Magnetic Hall effect sensor device which enables the user to increase/decrease the unit's output control signal based on the user's chosen actuator position setting. The rocker actuator mechanism may be in use when activated while finger pressure/control is applied. But the rocker actuator mechanism can also be in use while in the static (non-activated mode) depending on the user's design requirements/preference. The Rocker actuator will return to the mechanical (Rest) position setting when actuator activation in the form of finger pressure/control is removed/no longer present. The Rocker actuator may also be used as a Switching Device to turn On and/or Off a device/function, increase and decrease audio volume, medium search speed, brightness level, motion, etc.

The invention when activated will provide a variable output signal (either in Voltage or Digital Signal format) by utilizing a non-contact variable magnetic hall effect sensor device coupled via the magnetic field of a moving magnetic source. The physical actuator containing the magnetic source may travel in an arcuate motion rather than in a single plane circular motion (as with a rotating knob volume control, for example) or as in a single plane straight line or linear motion (as with a sliding potentiometer, for example).

The inventive manual control may be implemented with any variable or digital output hall effect sensor device as its sensing element. The output could be either an analog voltage or a digital encoded signal depending upon which type of sensor is used.

The invention comprises, in one form thereof, a manual mechanical control for an electronic apparatus, including a Variable Hall effect sensor device having an input voltage and a Variable output signal. A manually activated rocker styled actuator mechanism is fixedly attached to a magnet source. The magnet source is in the first position (rest) relative to the Variable Hall effect sensor device when the rocker mechanical actuator is in a first position (rest). The output signal is substantially at a minimum value (or at maximum value pending initial magnet polarity setting) when the magnet source is in the first position (rest) relative to the Variable Hall effect sensor device. The magnet source is in a second position (maximum) relative to the Variable Hall effect sensor device when the rocker mechanical actuator is in a second (maximum) position. The output signal is substantially at a maximum value (or at minimum value pending initial magnet polarity setting) when the magnet source is in the second position (maximum) relative to the Variable Hall effect sensor device. When the actuator/magnet source is in any other position between the first (rest) and second (maximum) positions relative to the Variable Hall Effect Sensor Device, based on this correlation, a proportional/variable analog or digitally encoded signal will be outputted at the apparatus's output.

The invention comprises, in another form thereof, a manual control for an electronic apparatus. The manual control includes a Variable Hall effect sensor device connected to an input voltage and producing a Variable output signal. A manual actuator is coupled to a magnet source and actuates the magnet source between a first position (rest) relative to the Variable Hall effect sensor device and a second position (maximum) relative to the Variable Hall effect sensor device. When the magnet source is in the first position (rest) relative to the Variable Hall effect sensor device, the output signal is substantially at a minimum value (or at maximum value pending initial magnet polarity setting). When the magnet source is in the second position (maximum) relative to the Variable Hall effect sensor device, the output signal is substantially at a maximum value (or at minimum value pending initial magnet polarity setting). When the actuator/magnet source is in any other position between the first (minimum) and second (maximum) positions relative to the Variable Hall Effect Sensor device, based on this correlation, a proportional/variable analog or digitally encoded signal will be outputted at the apparatus's output.

The invention comprises, in yet another form thereof, a manual control for an electronic apparatus. The manual control includes a Variable Hall effect sensor device having a first terminal and a second terminal. The first terminal is connected to an input voltage. The second terminal produces a variable output signal. A magnet source is manually movable between a first position (rest) relative to the Variable Hall effect sensor device and a second position (maximum) relative to the Variable Hall effect sensor device. When the magnet source is in the first position (rest) relative to the Variable Hall effect sensor device, the output signal is substantially at a minimum value (or at maximum value pending initial magnet polarity setting). When the magnet source is in the second position (maximum) relative to the Variable Hall effect sensor device, the output signal is substantially at a maximum value (or at minimum value pending initial magnet polarity setting).

An advantage of the present invention is that it may provide the user with a more ergonomically intuitive/natural manual control that increases or decreases a control function in any of a variety of end user apparatuses.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 2A is a front cross-sectional view of another embodiment of a rocker actuator potentiometer of the present invention in a first position (rest).

FIG. 2B is a front cross-sectional view of the rocker actuator potentiometer of FIG. 2A in a second position (maximum).

FIG. 4 is a flow chart of one embodiment of a manual control method of the present invention.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1B:
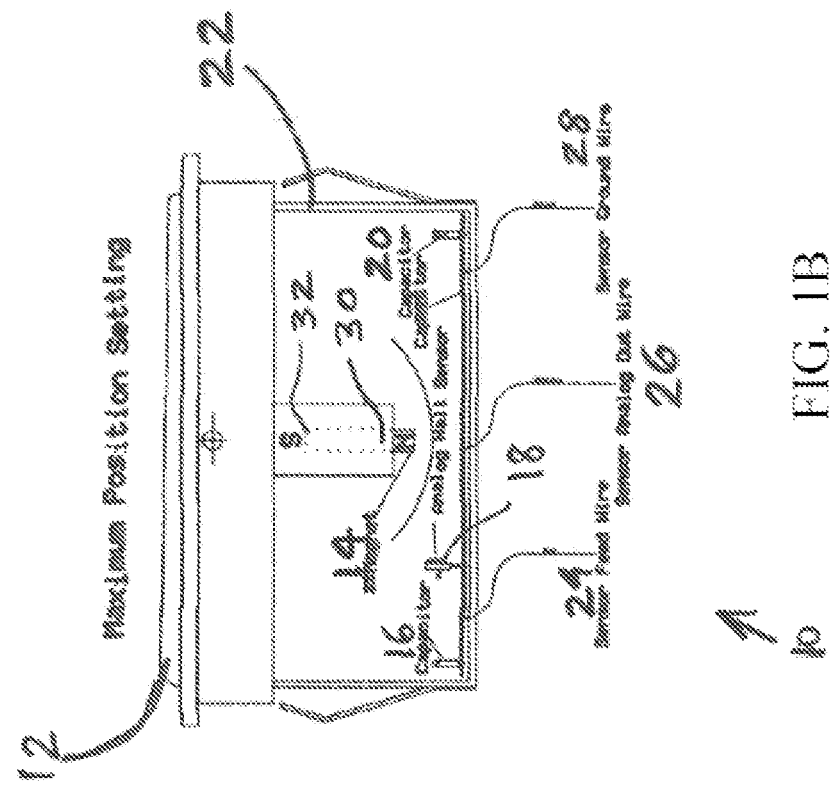
FIG. 1B is a front cross-sectional view of the rocker actuator potentiometer of FIG. 1A in a second position (maximum).
Figure 1A:
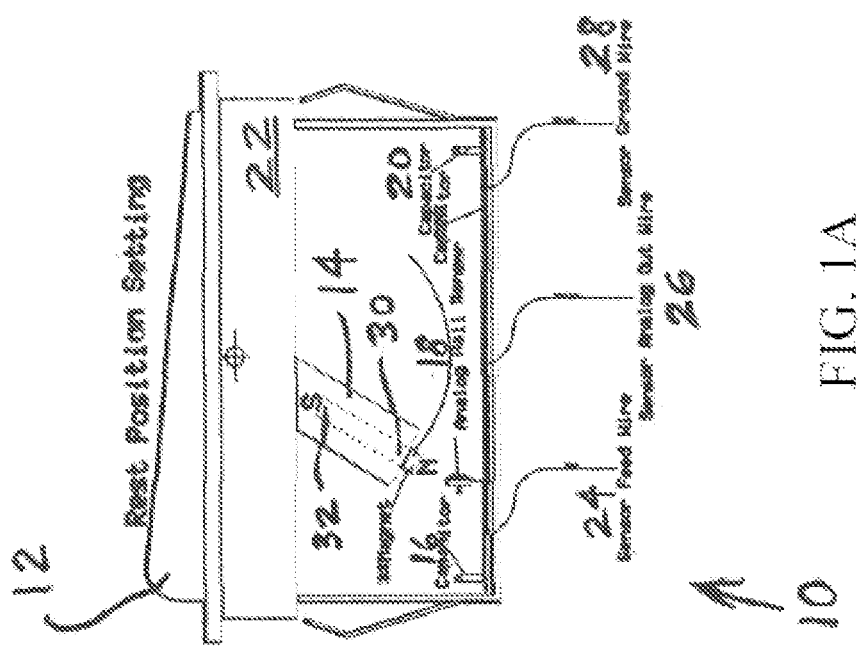
FIG. 1A is a front cross-sectional view of one embodiment of a rocker actuator potentiometer of the present invention in a first position (rest).

FIG. 1A illustrates one embodiment of a rocker actuator potentiometer 10 of the present invention including a manual actuator in the form of a rocker actuator mechanism 12, a magnet source 14, a first capacitor 16, a Variable Hall effect sensor device 18, and a second capacitor 20. The Variable Hall effect sensor device 18 may be part number A1324LUA-T marketed by Allegro MicroSystems LLC. All of the above components are retained by a common housing 22. Rocker actuator mechanism 12 may be either fixedly coupled or pivotally coupled to the magnet source 14, although a pivotal coupling between rocker actuator mechanism 12 and magnet source 14 is evident in a comparison between FIGS. 1A and 1B. A sensor feed wire 24 is connected to first capacitor 16 and Variable Hall effect sensor device 18. A sensor signal output wire 26 is connected to second capacitor 20 and Variable Hall effect sensor device 18. A sensor ground wire 28 is connected to electrical ground and to the ground terminal of each of first capacitor 16, Variable Hall effect sensor device 18, and second capacitor 20.

Magnet source 14 includes a distal north pole 30 and a proximal south pole 32. FIG. 1A shows rocker actuator mechanism 12 in a rest position wherein north pole 30 is substantially as close as possible to Variable Hall effect sensor device 18. In this rest position, the output signal at the sensor signal output wire 26 is at a minimum value. FIG. 1B shows rocker actuator mechanism 12 in a maximum actuator position wherein north pole 30 is substantially as far as possible from Variable Hall effect sensor device 18. In this maximum actuator position, the output signal at the sensor signal output wire 26 is at a maximum value. The user may manually move rocker actuator mechanism 12 between the rest position of FIG. 1A and the maximum actuator position of FIG. 1B, thus producing an output signal at the sensor signal output wire 26 that is proportionally related to the position of the Rocker Actuator Mechanism 12. Meaning that the output signal is either increased or decreased in value (pending the initial Magnet Source Polarity setting). The magnet source polarity setting is having the north pole at the distal end of the magnet source and the south pole at the proximal end of the magnet source, or vice versa. Rocker actuator mechanism 12 may be biased by a spring (not shown) into the rest position of FIG. 1A. A user may manually press rocker actuator mechanism 12 against the bias of the spring into the maximum actuator position of FIG. 1B.

In another embodiment of a rocker actuator potentiometer 40 shown in FIGS. 2A-B, magnet source 44 includes a distal south pole 62 and a proximal north pole 60. FIG. 2A shows rocker actuator mechanism 42 in a rest position wherein south pole 62 is substantially as close as possible to Variable Hall effect sensor device 48. In this rest position, the voltage at sensor signal output wire 56 is at a maximum value. FIG. 2B shows rocker actuator mechanism 42 in a maximum actuator position wherein south pole 62 is substantially as far as possible from Variable Hall effect sensor device 48. In this maximum actuator position, the voltage at sensor signal output wire 56 is at a minimum value. The user may manually move rocker actuator mechanism 42 between the rest position of FIG. 2A and the maximum actuator position of FIG. 2B, thus producing an output signal at the sensor signal output wire 26 that is proportionally related to the position of the Rocker Actuator Mechanism. Meaning that the output signal is either increased or decreased in value (pending the initial Magnet Source Polarity setting). Other details of rocker actuator potentiometer 40 may be substantially similar to those of rocker actuator potentiometer 10.

Figure 3:
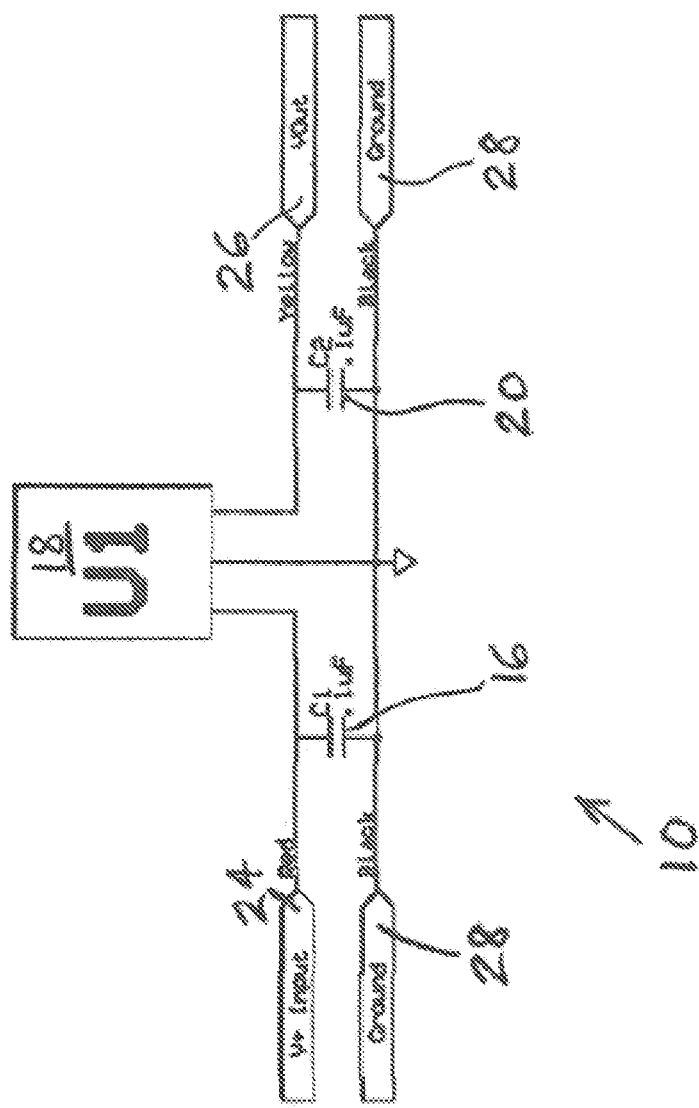
FIG. 3 is a schematic diagram of the rocker actuator potentiometer of FIGS. 1A-B.

FIG. 3 is a schematic diagram of rocker actuator potentiometer 10. First capacitor 16 may be connected across electrical ground and the V+ supply voltage input of sensor feed wire 24. Second capacitor 20 may be connected across electrical ground and the sensor signal output wire 26. Variable Hall effect sensor device 18 is connected to the V+ supply voltage input of sensor feed wire 24, electrical ground, and the sensor signal output wire 26. The schematic diagram of rocker actuator potentiometer 40 may be substantially similar to that of rocker actuator potentiometer 10.

FIG. 4 is a flow chart of one embodiment of a manual control method 400 of the present invention. In a first step 402, a variable hall effect sensor device having an input voltage and a variable output signal is provided. For example, variable hall effect sensor device 18 has an input voltage on sensor feed wire 24 and a variable output signal on sensor signal output wire 26.

In a second step 404, a manually activated rocker actuator mechanism is coupled to a magnet source. The magnet source is in a rest position relative to the variable hall effect sensor device when the rocker actuator mechanism is in a rest position. The variable output signal is substantially at one of a minimum value and a maximum value when the magnet source is in the rest position relative to the variable hall effect sensor device. The magnet source is in a deployed position relative to the variable hall effect sensor device when the rocker actuator mechanism is in a deployed position. The variable output signal is substantially at the other one of the minimum value and the maximum value when the magnet source is in the deployed position relative to the variable hall effect sensor device. For example, manually activated rocker actuator mechanism 12 is coupled to a magnet source 14. Magnet source 14 is in a rest position relative to the variable hall effect sensor device, as shown in FIG. 1a, when rocker actuator mechanism 12 is in a rest position. The variable output signal on sensor signal output wire 26 is at a minimum value when magnet source 14 is in the rest position relative to variable hall effect sensor device 18. Magnet source 14 is in a deployed position relative to the variable hall effect sensor device, as shown in FIG. 1b, when rocker actuator mechanism 12 is in a deployed position. The variable output signal on sensor signal output wire 26 is at a maximum value when magnet source 14 is in the deployed position relative to variable hall effect sensor device 18.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A manual control for an electronic apparatus, the manual control comprising:
   a Hall effect sensor having an input voltage and an output voltage;
   a bar magnet including a distal south pole and a proximal north pole;
   a manually actuatable rocker switch pivotably coupled to the magnet, the magnet being in a first position relative to the Hall effect sensor when the rocker switch is in a first position, the output voltage being zero when the magnet is in the first position relative to the Hall effect sensor, and the magnet being in a second position relative to the Hall effect sensor when the rocker switch is in a second position, the south pole of the bar magnet being farther from the Hall effect sensor in the first position than in the second position, the output voltage being at a maximum when the magnet is in the second position relative to the Hall effect sensor;
   a first capacitor having a first lead directly connected to the input voltage and a second lead directly connected to ground, and
   a second capacitor having a first lead directly connected to the output voltage and a second lead directly connected to ground.

2. The manual control of claim 1, further comprising a housing retaining each of the Hall effect sensor, the magnet, and the rocker switch.

3. The manual control of claim 1, wherein the rocker switch is non-manually biased into the first position.

4. The manual control of claim 1, wherein a portion of the rocker switch that is configured to be directly engaged by a human user is pivotable and non-fixed relative to the bar magnet.

5. A manual control for an electronic apparatus, the manual control comprising:
   a Hall effect sensor connected to an input voltage and producing an output voltage;
   a bar magnet including a distal north pole and a proximal south pole;
   a manual actuator pivotably coupled to the bar magnet and configured to actuate the bar magnet between a first position relative to the Hall effect sensor and a second position relative to the Hall effect sensor, the south pole of the bar magnet being farther from the Hall effect sensor in the first position than in the second position, wherein a portion of the manual actuator that is configured to be directly engaged by a human user is pivotable relative to the bar magnet and non-fixed relative to the bar magnet, and wherein when the bar magnet is in the first position relative to the Hall effect sensor the output voltage is zero, and when the bar magnet is in the second position relative to the Hall effect sensor the output voltage is at a maximum;
   a first capacitor including a first electrical conductor and a second electrical conductor, the first electrical conductor being electrically insulated from the second electrical conductor, the first electrical conductor being directly connected to the input voltage and the second electrical conductor being directly connected to ground, and
   a second capacitor including a first electrical conductor and a second electrical conductor, the first electrical conductor being electrically insulated from the second electrical conductor, the first electrical conductor being directly connected to the output voltage and the second electrical conductor being directly connected to ground.

6. The manual control of claim 5, further comprising a housing retaining each of the Hall effect sensor, the bar magnet, and the manual actuator.

7. The manual control of claim 5, wherein the bar magnet moves along an arcuate path between the first position and the second position.

8. A manual control for an electronic apparatus, the manual control comprising:
   a Hall effect sensor having a first terminal and a second terminal, the first terminal being connected to an input voltage, the second terminal producing an output voltage;
   a spring return rocker type actuator mechanism; and
   a bar magnet coupled to the actuator mechanism and including a distal south pole and a proximal north pole, the bar magnet being manually movable between a first position relative to the Hall effect sensor and a second position relative to the Hall effect sensor by manual actuation of the actuator mechanism by a human user, the south pole being farther from the Hall effect sensor in the first position than in the second position, wherein when the magnet is in the first position relative to the Hall effect sensor the output voltage is at a minimum, and when the magnet is in the second position relative to the Hall effect sensor the output voltage is at a maximum, wherein the human user may manually press the actuator mechanism against spring bias to thereby move the magnet into the second position, and the magnet is automatically biased back to the first position in response to removal of the manual pressure by the human user;
   a first capacitor including a first electrical conductor and a second electrical conductor, the first electrical conductor being electrically insulated from the second electrical conductor, the first electrical conductor being directly connected to the input voltage and the second electrical conductor being directly connected to ground, and
   a second capacitor including a first electrical conductor and a second electrical conductor, the first electrical conductor being electrically insulated from the second electrical conductor, the first electrical conductor being directly connected to the output voltage and the second electrical conductor being directly connected to ground.

9. The manual control of claim 8, further comprising a housing retaining both the Hall effect sensor and the magnet.

10. The manual control of claim 2, wherein the bar magnet is non-manually biased into the second position.

* * * * *